United States Patent
Kothandaraman et al.

(10) Patent No.: US 10,942,072 B2
(45) Date of Patent: Mar. 9, 2021

(54) NANOSCALE MAGNETIC TUNNEL JUNCTION ARRAYS FOR SUB-MICROMETER RESOLUTION PRESSURE SENSOR

(71) Applicant: International Business Machines Corporation, Armonk, NY (US)

(72) Inventors: Chandrasekharan Kothandaraman, New York, NY (US); Eric Raymond Evarts, Niskayuna, NY (US); Virat Vasav Mehta, Menands, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 16/196,801

(22) Filed: Nov. 20, 2018

(65) Prior Publication Data
US 2020/0158582 A1    May 21, 2020

(51) Int. Cl.
| | | |
|---|---|---|
| G01L 1/12 | (2006.01) | |
| H01L 41/47 | (2013.01) | |
| H01L 41/12 | (2006.01) | |

(52) U.S. Cl.
CPC ............ *G01L 1/125* (2013.01); *H01L 41/125* (2013.01); *H01L 41/47* (2013.01)

(58) Field of Classification Search
CPC ........... H01L 27/11206; H01L 23/5252; H01L 27/222; H01L 43/02; H01L 43/12; G01L 5/12; G01L 1/125; G01L 1/127
See application file for complete search history.

(56) References Cited

U.S. PATENT DOCUMENTS

| | | |
|---|---|---|
| 7,414,396 B2 | 8/2008 | Chung et al. |
| 7,547,480 B2 | 6/2009 | Chung et al. |

(Continued)

FOREIGN PATENT DOCUMENTS

| | | | |
|---|---|---|---|
| WO | 2006120277 A1 | 11/2006 | |
| WO | WO-2016011435 A1 * | 1/2016 | ............. G11C 11/18 |

OTHER PUBLICATIONS

Lohndorf et al., "Strain Sensors Based on Magnetostrictive GMR/TMR Structures", IEEE Transactions on Magnetics, Sep. 2002, pp. 2826-2828, vol. 38, No. 5.

*Primary Examiner* — Brandi N Hopkins
(74) *Attorney, Agent, or Firm* — Scully, Scott, Murphy & Presser, P.C.; Daniel P. Morris, Esq.

(57) ABSTRACT

A sub-micrometer pressure sensor including a multilayered magnetic tunnel junction (MTJ) pillar containing a magnetostrictive material layer above or below a magnetic free layer of the multilayered MTJ pillar is provided. Advanced patterning allows for scaling of the multilayered MTJ pillar down to 25 nm or below which enables the formation of a large array of extremely high resolution pressure sensors. By varying the thickness of the magnetostrictive material layer, the sensitivity of the pressure sensor can be fine tuned. Unique magnetostrictive materials in the multilayered MTJ pillar will alter the device current with the input of external pressure. Furthermore, unique arrays with much smaller critical elements can be organized in differential sensing arrangements of the multilayered MTJ pillar with pressure sensing capability that can outperform current piezoelectric based pressure sensing arrays.

20 Claims, 3 Drawing Sheets

(56) References Cited

U.S. PATENT DOCUMENTS

| | | |
|---|---|---|
| 9,872,624 B2 | 1/2018 | Fuji et al. |
| 9,952,030 B2 | 4/2018 | Kaji et al. |
| 9,964,606 B2 | 5/2018 | Isler |
| 9,999,356 B2 | 6/2018 | Giddings et al. |
| 2015/0014800 A1* | 1/2015 | Satoh ..................... H01L 43/12 |
| | | 257/421 |
| 2017/0016784 A1 | 1/2017 | Katti |

* cited by examiner

NANOSCALE MAGNETIC TUNNEL JUNCTION ARRAYS FOR SUB-MICROMETER RESOLUTION PRESSURE SENSOR

BACKGROUND

The present application relates to a pressure sensor and a method of forming the same. More particularly, the present application relates to a sub-micrometer pressure sensor which includes a multilayered magnetic tunnel junction (MTJ) pillar containing a magnetostrictive material layer that forms an interface with a magnetic free layer.

Current pressure sensors rely on large arrays of piezoelectric materials or magnetostrictive materials in dimension ranges of multiple micrometers to get a measurable electric response on sensed pressure. Piezoelectric based pressure sensors are less sensitive in terms of the magnitude of the pressure sensed and imprecise in specific location where pressure changes occur.

There is thus a need for providing a sub-micrometer pressure sensor which is capable of precisely determining the magnitude of the pressure sensed and the specific location in which pressure changes occur.

SUMMARY

A sub-micrometer pressure sensor including a multilayered magnetic tunnel junction (MTJ) pillar containing a magnetostrictive material layer above or below a magnetic free layer of the multilayered MTJ pillar is provided. Advanced patterning allows for scaling of the multilayered MTJ pillar down to 25 nm or below which enables the formation of a large array of extremely high resolution pressure sensors. By varying the thickness of the magnetostrictive material layer, the sensitivity of the pressure sensor can be fine tuned. Unique magnetostrictive materials in the multilayered MTJ pillar will alter the device current with the input of external pressure. Furthermore, unique arrays with much smaller critical elements can be organized in differential sensing arrangements of the multilayered MTJ pillar with pressure sensing capability that can outperform current piezoelectric based pressure sensing arrays.

In one aspect of the present application, a sub-micrometer pressure sensor is provided. In one embodiment of the present application, the sub-micrometer pressure sensor includes a multilayered magnetic tunnel junction (MTJ) pillar located on a surface of a conductive landing pad; the conductive landing pad serves as a bottom electrode layer of the pressure sensor. The multilayered MTJ pillar includes a magnetostrictive material layer in direct physical contact with a surface of a magnetic free layer. A top electrode layer is located on a topmost surface of the multilayered MTJ material pillar.

In another aspect of the present application, a method of forming a sub-micrometer pressure sensor is provided. In one embodiment, the method includes forming a first electrically conductive structure embedded in a first interconnect dielectric material layer, wherein a conductive landing pad is located on a surface of the first electrically conductive structure; the conductive landing pad serves as a bottom electrode layer of the pressure sensor. Next, a stack of a multilayered magnetic tunnel junction (MTJ) pillar and a top electrode layer are formed on a surface of the conductive landing pad. The multilayered MTJ pillar includes a magnetostrictive material layer in direct physical contact with a surface of a magnetic free layer. A second electrically conductive structure is formed in a second interconnect dielectric material layer that laterally surrounds the multilayered MTJ pillar and the top electrode layer, wherein the second electrically conductive structure contacts a surface of the top electrode layer.

DETAILED DESCRIPTION

Figure 1:
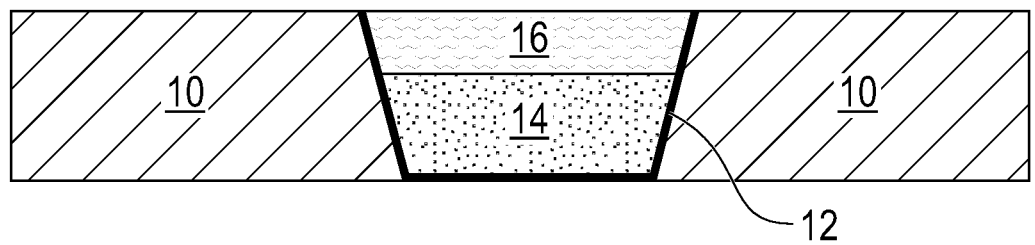
FIG. 1 is a cross sectional view of an exemplary structure that can be employed in the present application and including a conductive landing pad located on a surface of a first electrically conductive structure that is embedded in a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in the present application in forming the sub-micrometer pressure sensor of the present application. The exemplary structure of FIG. 1 includes a conductive landing pad located 16 located on a surface of a first electrically conductive structure 14 that is embedded in a first interconnect dielectric material layer 10.

It is noted that the drawings of the present application illustrate a device area in which a pressure sensor in accordance with the present application will be formed. A non-pressure sensor device area may be located laterally adjacent to the pressure sensor device area illustrated in the drawings of the present application. It is further noted that although the present application, describes and illustrates a single conductive landing pad 16 located on a single electrically conductive structure 14, the present application contemplates embodiments in which a plurality of electrically conductive structures are embedded in the first interconnect dielectric material layer 10, wherein a conductive landing pad 16 is formed upon each of the electrically conductive structures 14 of the plurality of electrically conductive structures.

The first interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first electrically conductive structure 14 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner 12 is formed along the sidewalls and a bottom wall of the first electrically conductive structure 14. In some embodiments, no diffusion barrier liner is present. The diffusion barrier liner 12 is composed of a diffusion barrier material (i.e., a material that serves as a barrier to prevent a conductive material such as copper from diffusing there through). Examples of diffusion barrier materials that can be used in providing the diffusion barrier liner 12 include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the first interconnect dielectric material layer 10, the first electrically conductive structure 14, and, if present, diffusion barrier liner 12 may be formed utilizing conventional processes that are well-known to those skilled in the art. So as to not obscure the method of the present application, the techniques used to form the interconnect level including the first interconnect dielectric material layer 10, the first electrically conductive structure 14, and, if present, diffusion barrier liner 12 are not provided herein. It is noted that at least one other interconnect level and/or a middle-of-the-line (MOL) level may be located beneath the interconnect level including the first interconnect dielectric material layer 10, the first electrically conductive structure 14, and, if present, diffusion barrier liner 12. These other levels are not shown for clarity.

As is shown, the conductive landing pad 16, which serves as a bottom electrode of the pressure sensor of the present application, is located on a surface of the first electrically conductive structure 14 that is embedded in the first interconnect dielectric material layer 10. In some embodiments and as is illustrated, the conductive landing pad 16 is located on a recessed surface of the first electrically conductive structure 14. In such an embodiment, and prior to forming the conductive landing pad 16, an upper portion of the first electrically conductive structure 14 is removed utilizing a recess etching process, and thereafter the conductive landing pad 16 is formed upon the recessed surface of the first electrically conductive structure 14. In other embodiments (not shown), the conductive landing pad 16 is formed on a non-recessed surface of the first electrically conductive structure 14. In such an embodiment, a dielectric capping layer (not shown) may be located laterally adjacent to the conductive landing pad 16 and on a surface of the first interconnect dielectric material layer 10.

Conductive landing pad 16, which is formed on a physically exposed surface of the first electrically conductive structure 14 may be composed of Ta, TaN, Ti, TiN, Ru, RuN, RuTa, RuTaN, Co, CoWP, CoN, W, WN or any combination thereof. The conductive landing pad 16 may have a thickness from 2 nm to 25 nm; other thicknesses are possible and can be used in the present application as the thickness of the conductive landing pad 16. The conductive landing pad 16 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides the conductive landing pad 16.

In some embodiments (not shown), the conductive landing pad 16 has a topmost surface that is coplanar with a topmost surface of a dielectric capping layer that may be present laterally adjacent to the conductive landing pad 16 and on a topmost surface of the first interconnect dielectric material layer 10. In other embodiments and as is shown in FIG. 1, the conductive landing pad 16 has a topmost surface that is coplanar with a topmost surface of the first interconnect dielectric material layer 10.

Figure 2:
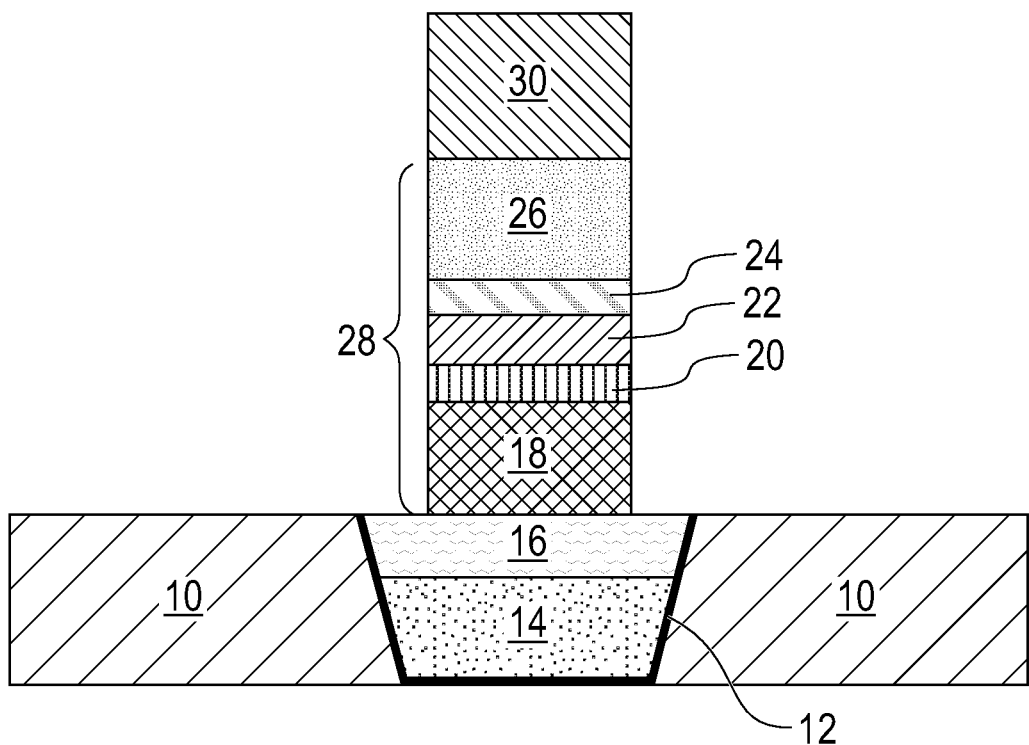
FIG. 2 is a cross sectional view of the exemplary structure of FIG. 1 after forming a multilayered magnetic tunnel junction (MTJ) pillar and a top electrode layer, wherein the multilayered MTJ pillar includes a magnetostrictive material layer located directly on a topmost surface of a magnetic free layer.

Referring now to FIG. 2, there is illustrated the exemplary structure of FIG. 1 after forming a multilayered magnetic tunnel junction (MTJ) pillar 28 and a top electrode layer 30. In the illustrated embodiment, the multilayered MTJ pillar 28 includes a magnetostrictive material layer 24 located directly on a topmost surface of a magnetic free layer 22. In this embodiment, the magnetostrictive material layer 24 forms a first interface with the magnetic free layer 22 and a second interface, that is opposite the first interface, with a MTJ cap layer 26 of the multilayered MTJ pillar 28.

Figure 3:
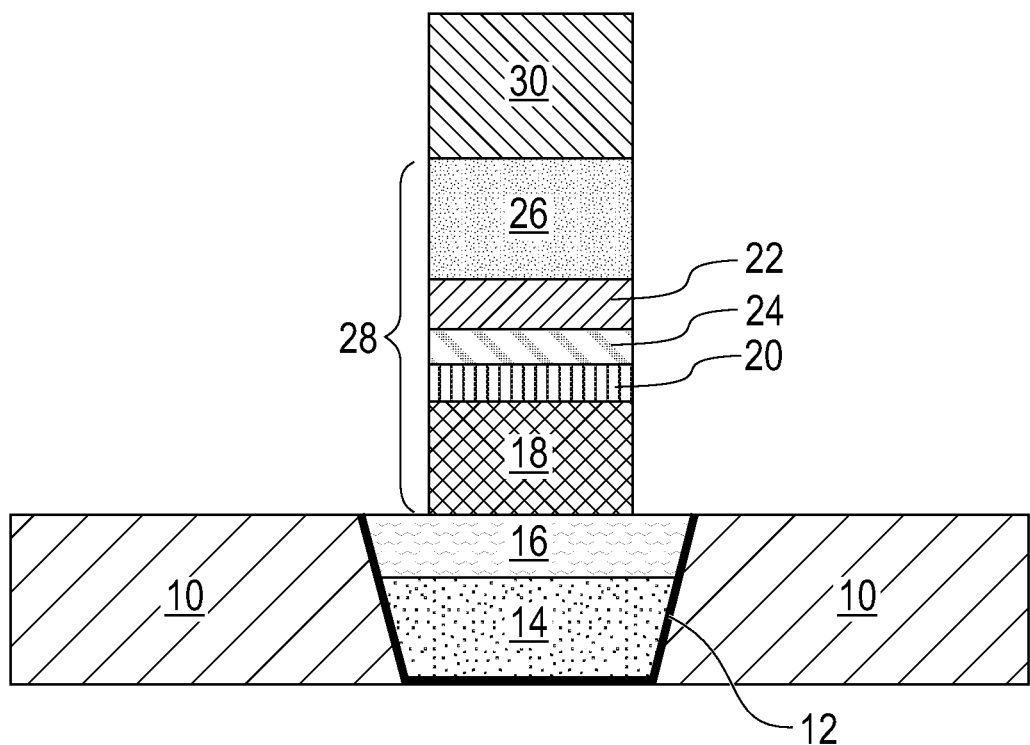
FIG. 3 is a cross sectional view of an alternatively exemplary structure of the present application and including a multilayered MTJ pillar that contains a magnetostrictive material layer located directly on a bottommost surface of a magnetic free layer.

In another embodiment, the magnetostrictive material layer 24 is located directly on a bottommost surface of a magnetic free layer 22 (see, for example, the embodiment illustrated in FIG. 3 of the present application). In such an embodiment, the magnetostrictive material layer 24 forms a first interface with a tunnel barrier layer 20 of the multilayered MTJ pillar 28 and a second interface, that is opposite the first interface, with the magnetic free layer 22.

The multilayered MTJ pillar 28 and the top electrode layer 30 can be formed by first depositing blanket layers of various materials that provide the multilayered MTJ pillar 28 and the top electrode layer 30. The depositing of the blanket layers of various materials that provide the multilayered MTJ pillar 28 and the top electrode layer 30 can include chemical vapor deposition (CVD), plasma enhanced chemical vapor deposition (PECVD), atomic layer deposition (ALD), physical vapor deposition (PVD), sputtering, or plating. After depositing of the various blanket layers of materials that provide the multilayered MTJ pillar 28 and the top electrode layer 30, a patterning process such as, for example, photolithography and etching, can be used to provide the exemplary stack of multilayered MTJ pillar 28 and top electrode layer 32 shown in FIG. 2. The stack of the multilayered MTJ pillar 28 and top electrode layer 30 is cylindrical in shape and it may have a dimension from 25 nm to 100 nm; although other asymmetric shapes and dimensions for the stack of the multilayered MTJ pillar 28 and top electrode layer 30 are possible and are contemplated in the present application. The height of the multilayered MTJ pillar 28 and the top electrode layer 30 may be 50 nm or below. Other heights are possible and can be used for the height of the multilayered MTJ pillar 28 and the top electrode layer 30.

In the illustrated embodiment of FIG. 2, the multilayered MTJ pillar 28 may include a stack, of from bottom to top, a magnetic reference layer (that may include one or more magnetic reference materials) 18, a tunnel barrier layer 20, a magnetic free layer (that may include one or more magnetic reference materials) 22, a magnetostrictive material layer 24 and a MTJ cap 26.

In the illustrated embodiment of FIG. 3, the multilayered MTJ pillar 28 may include a stack, of from bottom to top, a magnetic reference layer (that may include one or more magnetic reference materials) 18, a tunnel barrier layer 20, a magnetostrictive material layer 24, a magnetic free layer (that may include one or more magnetic reference materials) 22, and a MTJ cap 26.

The magnetic reference layer 18 has a fixed magnetization. The magnetic reference layer 18 may be composed of a metal or metal alloy that includes one or more metals exhibiting high spin polarization. In alternative embodiments, exemplary metals for the formation of the magnetic reference layer include iron, nickel, cobalt, chromium, boron, or manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 20 is composed of an insulator material and is formed at such a thickness as to provide an appropriate tunneling resistance. Exemplary materials for the tunnel barrier layer 20 include magnesium oxide, aluminum oxide, and titanium oxide, or materials of higher electrical tunnel conductance, such as semiconductors or low-bandgap insulators.

The magnetic free layer 22 is composed of a magnetic material with a magnetization that can be changed in orientation relative to the magnetization orientation of the magnetic reference layer 18. Exemplary materials for the magnetic free layer 22 include alloys and/or multilayers of cobalt, iron, alloys of cobalt-iron, nickel, alloys of nickel-iron, and alloys of cobalt-iron-boron.

The magnetostrictive material layer 24 is composed of any conductive material which undergoes a change in magnetic moment when a stress is applied thereto. Illustrative examples of such materials that can be used as the magnetostrictive material layer 24 include, but are not limited to, FeSi, FeAl, CoFebSi, $SmFe_2$, $TbFe_2$ or an alloy of Tb—Dy—Fe. The magnetostrictive material layer 24 may have a thickness from 1 nm to 30 nm. Other thicknesses are possible and can be used in the present application as the thickness of the magnetostrictive material layer 24. It is noted that the thickness of the magnetostrictive material layer 24 can be adjusted to fine tune the sensitivity range of the sensor of the present application.

The MTJ cap layer 26 can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer 26 may have a thickness from 2 nm to 25 nm; other thicknesses are possible and can be used in the present application as the thickness of the MTJ cap layer 26.

The top electrode layer 30 may be composed of one of the conductive materials mentioned above for the conductive landing pad 16. The conductive material that provides the top electrode layer 30 is typically compositionally different from the MTJ cap layer 26. The top electrode layer 30 can have a thickness within the thickness range mentioned above for the conductive landing pad 16. The top electrode layer 30 may be formed utilizing one of the deposition processes mentioned above in providing the conductive landing pad 16.

Figure 4:
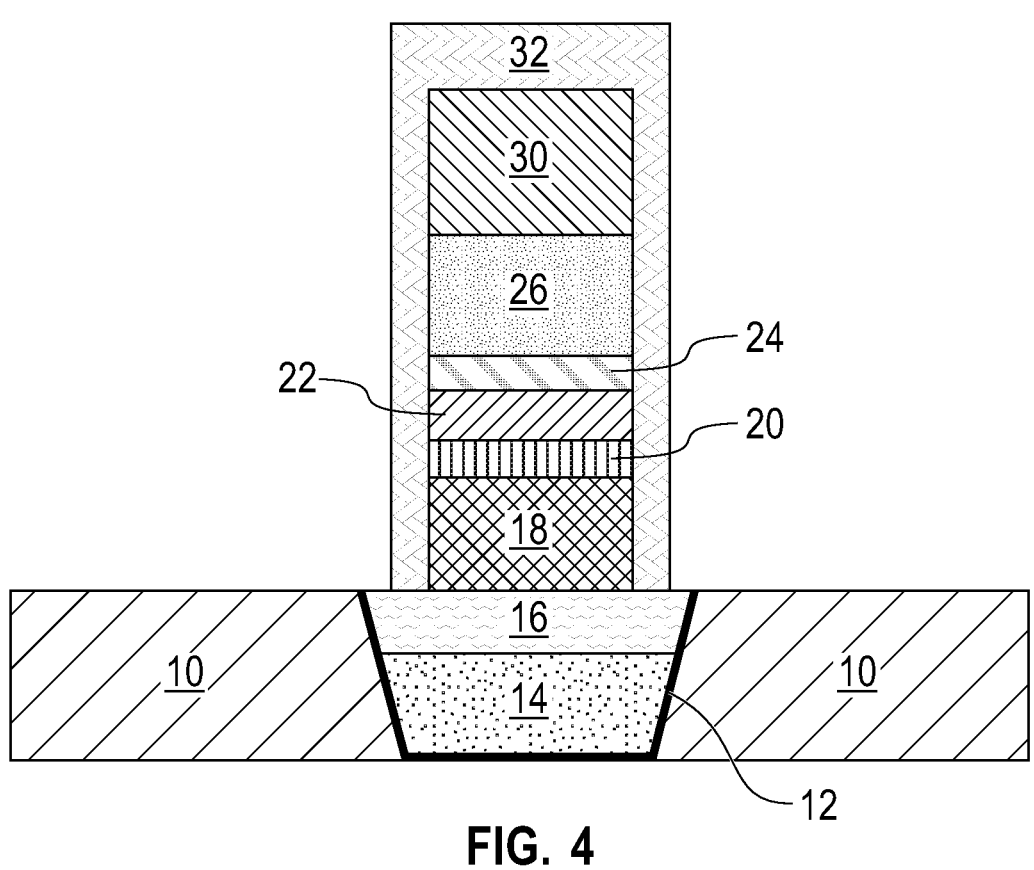
FIG. 4 is a cross sectional view of the exemplary structure of FIG. 2 after forming a passivation layer on physically exposed surfaces of the multilayered MTJ pillar and the top electrode layer.

Referring now to FIG. 4, there is illustrated the exemplary structure of FIG. 2 after forming a passivation layer 32 on physically exposed surfaces of the multilayered MTJ pillar 28 and the top electrode layer 30. In some embodiments, the passivation layer 32 is formed on physically exposed surfaces of the multilayered MTJ pillar 28 and the top electrode layer 30 of the exemplary structure shown in FIG. 3. In some embodiments (not shown), the passivation layer 32 may extend onto the physically exposed surfaces of the interconnect level including the first interconnect dielectric material layer 10 and the first electrically conductive structure 14.

The passivation layer 32 is composed of a dielectric material. In one embodiment, the passivation layer 32 is composed of silicon nitride. In another embodiment, the passivation layer 32 may be composed of a dielectric material that contains atoms of silicon, carbon and hydrogen. In some embodiments, and in addition to atoms of carbon and hydrogen, the dielectric material may include atoms of at least one of nitrogen and oxygen. In other embodiments, and in addition to atoms of silicon, nitrogen, carbon and hydrogen, the dielectric material may include atoms of boron. In one example, the passivation layer 32 may be composed of an nBLOK dielectric material that contains atoms of silicon, carbon, hydrogen, nitrogen and oxygen. In alternative example, the passivation layer 32 may be composed of a SiBCN dielectric material that contains atoms of silicon, boron, carbon, hydrogen, and nitrogen.

The passivation layer 32 can be formed utilizing a deposition process such as, for example, CVD, PECVD, PVD, or ALD. The passivation layer 32 may have a thickness from 10 nm to 200 nm. Other thicknesses are possible and can be employed as the thickness of the passivation layer 32.

Figure 5:
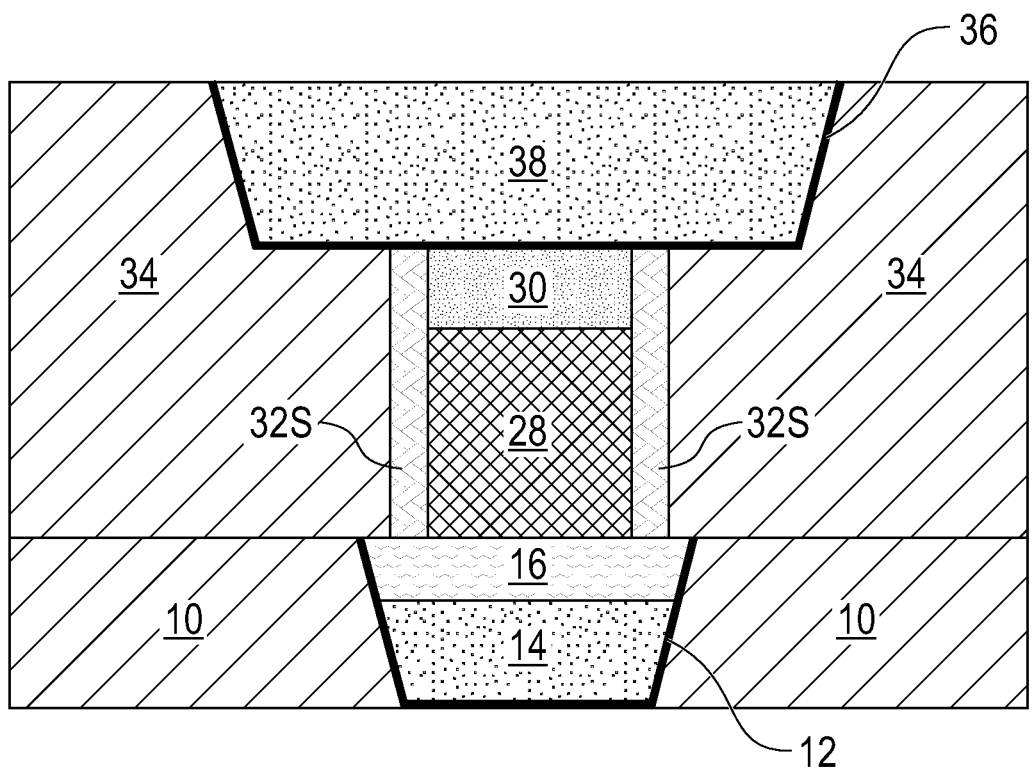
FIG. 5 is a cross sectional view of the exemplary structure of FIG. 4 after forming a second interconnect dielectric material layer surrounding the multilayered MTJ pillar and the top electrode layer, wherein the second interconnect dielectric material layer includes a second electrically conductive structure embedded therein and in contact with a surface of the top electrode layer.

Referring now to FIG. 5, there is illustrated the exemplary structure of FIG. 4 after forming a second interconnect dielectric material layer 34 surrounding the multilayered MTJ pillar 28 and top electrode layer 30, wherein the second interconnect dielectric material layer 34 includes a second electrically conductive structure 38 embedded therein and in contact with a surface of the top electrode layer 30.

The second interconnect dielectric material layer 34 may include one of the dielectric materials mentioned above for the first interconnect dielectric material layer 10. In one embodiment, the second interconnect dielectric material layer 34 is composed of a same dielectric material as the first interconnect dielectric material layer 10. In another embodiment, the second interconnect dielectric material layer 34 is composed of a different dielectric material than the first interconnect dielectric material layer 10. The second interconnect dielectric material layer 34 may be formed by utilizing one of the deposition processes mentioned above in forming the first interconnect dielectric material layer 10. The second interconnect dielectric material layer 34 may have a thickness within the thickness range mentioned above for the first interconnect dielectric material layer 10. In some embodiments, a dielectric capping layer (not shown) may be present between the first and second interconnect dielectric material layers (10, 34).

An opening is then formed into an upper portion of the second interconnect dielectric material layer 36 and the passivation dielectric layer 32 to physically expose a surface of top electrode layer 30. The opening can be formed by lithography and etching. During the etching, the passivation layer 32 that is present on the top electrode layer 30 is removed; passivation material remains on the sidewalls of the MTJ multilayer pillar 28 and the top electrode layer 30. The remaining passivation material may be referred to herein as a passivation spacer 32S. The passivation spacer 32S typically has a topmost surface that is coplanar with a topmost surface of the top electrode layer 30.

A diffusion barrier material liner 36 and a second electrically conductive structure 38 are then formed within the opening. The diffusion barrier material liner 36 and the second electrically conductive structure 38 can be formed by deposition of a diffusion barrier material layer and an electrically conductive metal or metal alloy layer, and then performing a planarization process to remove the diffusion barrier material layer and the electrically conductive metal or metal alloy layer that is present outside the opening and above the topmost surface of the second interconnect dielectric material layer 34. In some embodiments, the diffusion barrier material liner 36 is omitted.

The diffusion barrier material liner 36 may include one of the diffusion barrier materials mentioned above for diffusion barrier liner 12. In one embodiment, diffusion barrier material liner 36 is composed of a same diffusion barrier material as diffusion barrier liner 12. In another embodiment, diffusion barrier material liner 36 is composed of a different diffusion barrier material than diffusion barrier liner 12. A diffusion barrier material layer that provides the diffusion battier material liner 36 may be deposited utilizing one of the deposition processes mentioned above in forming diffusion barrier liner 12. Diffusion barrier material liner 38 may have a thickness within the thickness range mentioned above for diffusion barrier liner 12.

The second electrically conductive structure 38 may include one of the electrically conductive metals or metal alloys mentioned above for the first electrically conductive structure 14. In one embodiment, the second electrically conductive structure 38 is composed of a same electrically conductive metal or metal alloy as the first electrically conductive structure 14. In another embodiment, the second electrically conductive structure 38 is composed of a different electrically conductive metal or metal alloy than the first electrically conductive structure 14. The electrically conductive metal or metal alloy that provides the second electrically conductive structure 38 may be deposited utilizing one of the deposition processes mentioned above in forming the electrically conductive structure 14.

Notably, FIG. 5 illustrates a sub-micrometer pressure sensor of the present application. The sub-micrometer pressure sensor includes a multilayered MTJ pillar 28 contains a magnetic reference layer 18, a tunnel barrier layer 20, a magnetic free layer 22 and a MTJ cap layer 26 which is located on a surface of a conductive landing pad 16. The multilayered MTJ pillar 28 further includes a magnetostrictive material layer 24 in direct physical contact with a surface of the magnetic free layer 22. The magnetostrictive material layer 24 may be located above or below the magnetic free layer 22 as shown in FIGS. 2 and 3, respectively. An electrode layer, i.e., top electrode layer 30, is located on a topmost surface of the multilayered MTJ pillar 28. Although the sub-micrometer pressure sensor shown in FIG. 5 includes a single multilayered MTJ pillar 28 located on a single conductive landing pad 16, the sub-micrometer pressure sensor of the present application includes a plurality of multilayered MTJ material pillars 28 each including a magnetostrictive material layer 24 in contact with a surface of a magnetic free layer 22 and located on a surface of a conductive landing pad 16.

When a pressure is applied to the magnetostrictive material layer 24 of the multilayered MTJ pillar 28 of the sub-micrometer pressure sensor, the magnetization orientation of the magnetic free layer 22 is changed. This change produces a change in the electrical resistance of the sensor through the tunneling magnetoresistive effect. This change in the resistance is very sensitive to the magnitude of the pressure and increases as the size of the sensor decreases, contrary to existing technologies that lose signal as the device shrinks.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A sub-micrometer pressure sensor comprising:
   a multilayered magnetic tunnel junction (MTJ) pillar located on a surface of a conductive landing pad, wherein the multilayered MTJ pillar comprises a magnetostrictive material layer in direct physical contact with a surface of a magnetic free layer; and
   a top electrode layer located on a topmost surface of the multilayered MTJ material pillar.

2. The sub-micrometer pressure sensor of claim 1, wherein the multilayered magnetic tunnel junction (MTJ) pillar further comprises a magnetic reference layer, a tunnel barrier layer, and a MTJ cap layer.

3. The sub-micrometer pressure sensor of claim 2, wherein the magnetostrictive material layer is in direct physical contact with a topmost surface of the magnetic free layer, and forms an interface with the MTJ cap layer.

4. The sub-micrometer pressure sensor of claim 2, wherein the magnetostrictive material layer is in direct physical contact with a bottommost surface of the magnetic free layer, and forms an interface with the tunnel barrier layer.

5. The sub-micrometer pressure sensor of claim 1, wherein the magnetostrictive material layer is composed of a conductive material that undergoes a change in magnetic moment when a stress is applied thereto.

6. The sub-micrometer pressure sensor of claim 5, wherein the magnetostrictive material layer is composed of FeSi, FeAl, CoFebSi, $SmFe_2$, $TbFe_2$ or an alloy of Tb—Dy—Fe.

7. The sub-micrometer pressure sensor of claim 1, wherein the magnetostrictive material layer has a thickness from 1 nm to 30 nm.

8. The sub-micrometer pressure sensor of claim 1, wherein the conductive landing pad is located on a surface of a first electrically conductive structure that is embedded in a first interconnect dielectric material layer.

9. The sub-micrometer pressure sensor of claim 8, further comprising a second interconnect dielectric material layer located above the first interconnect dielectric material layer and laterally surrounding the multilayered magnetic tunnel junction (MTJ) pillar and the top electrode layer, wherein a second electrically conductive structure is present in the second interconnect dielectric material layer that contacts a surface of the top electrode layer.

10. The sub-micrometer pressure sensor of claim 8, wherein the conductive landing land has a topmost surface that is coplanar with a topmost surface of the first interconnect dielectric material layer.

11. The sub-micrometer pressure sensor of claim 1, further comprising a passivation spacer located on a sidewall of the multilayered MTJ pillar and the electrode layer.

12. A method of forming a sub-micrometer pressure sensor, the method comprising:
    forming a first electrically conductive structure embedded in a first interconnect dielectric material layer, wherein a conductive landing pad is located on a surface of the first electrically conductive structure;
    forming a stack of a multilayered magnetic tunnel junction (MTJ) pillar and a top electrode layer on a surface of the conductive landing pad, wherein the multilayered MTJ pillar includes a magnetostrictive material layer in direct physical contact with a surface of a magnetic free layer; and
    forming a second electrically conductive structure in a second interconnect dielectric material layer that laterally surrounds the multilayered MTJ pillar and the top electrode layer, wherein the second electrically conductive structure contacts a surface of the top electrode layer.

13. The method of claim 12, wherein the multilayered magnetic tunnel junction (MTJ) pillar further comprises a magnetic reference layer, a tunnel barrier layer, and a MTJ cap layer.

14. The method of claim 13, wherein the magnetostrictive material layer is in direct physical contact with a topmost surface of the magnetic free layer, and forms an interface with the MTJ cap layer.

15. The method of claim 13, wherein the magnetostrictive material layer is in direct physical contact with a bottommost surface of the magnetic free layer, and forms an interface with the tunnel barrier layer.

16. The method of claim 12, wherein the magnetostrictive material layer is composed of a conductive material that undergoes a change in magnetic moment when a stress is applied thereto.

17. The method of claim 16, wherein the magnetostrictive material layer is composed of FeSi, FeAl, CoFebSi, $SmFe_2$, $TbFe_2$ or an alloy of Tb—Dy—Fe.

18. The method of claim 12, wherein the magnetostrictive material layer has a thickness from 1 nm to 30 nm.

19. The method of claim 12, further comprising forming, prior to the forming of the second electrically conductive structure, a passivation layer on physically exposed surfaces of the multilayered MTJ pillar and the top electrode layer, and wherein during the forming of the passivation layer a portion of the passivation layer located above the top electrode layer is removed.

20. The method of claim 12, wherein the surface of the first electrically conductive structure is a recessed surface.

* * * * *